(12) United States Patent
Katti

(10) Patent No.: US 9,257,970 B1
(45) Date of Patent: Feb. 9, 2016

(54) MAGNETIC LATCH

(71) Applicant: Honeywell International Inc., Morristown, NJ (US)

(72) Inventor: Romney R. Katti, Shorewood, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/577,528

(22) Filed: Dec. 19, 2014

(51) Int. Cl.
*G11C 13/00* (2006.01)
*H03K 3/037* (2006.01)
*H03K 3/51* (2006.01)

(52) U.S. Cl.
CPC .............. *H03K 3/0375* (2013.01); *H03K 3/51* (2013.01); *G11C 13/0004* (2013.01); *G11C 13/0007* (2013.01); *G11C 13/0069* (2013.01)

(58) Field of Classification Search
CPC ........... G11C 13/0069; G11C 13/0004; G11C 13/0007
USPC .................. 365/148, 46, 48, 130, 173, 189.08
See application file for complete search history.

(56) References Cited

U.S. PATENT DOCUMENTS

| | | | |
|---|---|---|---|
| 6,147,900 A | 11/2000 | Pohm | |
| 6,381,171 B1 | 4/2002 | Inomata et al. | |
| 6,462,979 B2 | 10/2002 | Schloesser et al. | |
| 6,980,469 B2 | 12/2005 | Kent et al. | |
| 7,289,356 B2 | 10/2007 | Diao et al. | |
| 7,339,818 B2 | 3/2008 | Katti et al. | |
| 7,357,995 B2 | 4/2008 | Parkin | |
| 7,860,351 B2 | 12/2010 | Yagami | |
| 7,898,833 B2 | 3/2011 | Prejbeanu et al. | |
| 7,943,399 B2 | 5/2011 | Sun et al. | |
| 7,973,349 B2 | 7/2011 | Huai et al. | |
| 8,058,696 B2 | 11/2011 | Ranjan et al. | |
| 8,059,453 B2 | 11/2011 | Wang et al. | |
| 8,243,502 B2 | 8/2012 | Sakimura et al. | |
| 8,299,533 B2 | 10/2012 | Campi, Jr. et al. | |
| 8,411,493 B2 | 4/2013 | Katti | |

(Continued)

FOREIGN PATENT DOCUMENTS

EP 0853310 A2 7/1998

OTHER PUBLICATIONS

"Patents; Researchers Submit Patent Application, "Magnetoresistive Logic Cell and Method of Use", for Approval," Information Technology Newsweekly, NewsRx, Sep. 10, 2013, 7 pp.
Chan, "Spintronics—Magnetoresistive RAM," retrieved from nanocad.ee.ucla.edu/pub/Main/SnippetTutorial/May19_Spintronics.pdf on Dec. 19, 2014, 13 pp.

*Primary Examiner* — Jason Lappas
(74) *Attorney, Agent, or Firm* — Shumaker & Sieffert, P.A.

(57) ABSTRACT

A device includes a first free layer, the first free layer being capable of magnetic polarization using a first electrical current, a fixed layer, the fixed layer having a static magnetic polarization, and a first spacer layer disposed between the first free layer and the fixed layer. The device may also include a second free layer, the second free layer being capable of magnetic polarization using a second electrical current, and a second spacer layer disposed between the second free layer and the fixed layer, wherein the device is operable, via the first electrical current, to store a binary value, the binary value being represented by a resistance characteristic of the first spacer layer, and wherein the device is operable, via the second electrical current, to store a compliment of the binary value, the compliment being represented by a resistance characteristic of the second spacer layer.

20 Claims, 8 Drawing Sheets

(56) References Cited

U.S. PATENT DOCUMENTS

| | | |
|---|---|---|
| 8,456,896 B2 | 6/2013 | Yamada et al. |
| 8,542,522 B2 | 9/2013 | Snider |
| 8,743,593 B2 | 6/2014 | Hayakawa et al. |
| 2010/0110757 A1* | 5/2010 | Ma ............... G11C 13/0038 365/148 |
| 2012/0230089 A1 | 9/2012 | Yamada et al. |
| 2013/0272059 A1 | 10/2013 | Lin et al. |

* cited by examiner

MAGNETIC LATCH

TECHNICAL FIELD

The present disclosure relates to logic devices and more particular to magnetic logic.

BACKGROUND

Storing information, retrieving stored information, and/or performing operations on such information are functions that have become almost ubiquitous in all computing devices. Various types of technologies have evolved to serve this purpose. As one example, complementary metal-oxide-semiconductor (CMOS) technology may be found in microprocessors, microcontrollers, static random access memory (SRAM), and other digital and analog circuits. As the use of computing devices proliferates, information storage and manipulation functionality continues to be performed under harsher, more constrained conditions. For instance, aerospace applications may require devices that are capable of reliably performing data storage and manipulation for months or years on little power and without maintenance.

SUMMARY

In one example a device includes a first free layer, the first free layer being capable of magnetic polarization using a first electrical current, a fixed layer, the fixed layer having a static magnetic polarization, and a first spacer layer disposed between the first free layer and the fixed layer. The device may also include a second free layer, the second free layer being capable of magnetic polarization using a second electrical current, and a second spacer layer disposed between the second free layer and the fixed layer, wherein the device is operable, via the first electrical current, to store a binary value, the binary value being represented by a resistance characteristic of the first spacer layer, and wherein the device is operable, via the second electrical current, to store a compliment of the binary value, the compliment being represented by a resistance characteristic of the second spacer layer.

In another example a method includes receiving a first electrical input current by a device comprising a first free layer capable of magnetic polarization, a fixed layer having a static magnetic polarization, a first spacer layer disposed between the first free layer and the fixed layer, a second free layer capable of magnetic polarization, and a second spacer layer disposed between the second free layer and the fixed layer, wherein the first electrical input current is applied from the first free layer to the second spacer layer; and magnetically polarizing, by the device and based on a polarity of the first electrical input current, the first free layer in either a first direction or a second direction, the second direction being opposite the first direction.

In another example a system includes a first magnetic latch, comprising: a first free layer, the first free layer being capable of magnetic polarization using a first electrical input voltage, a first fixed layer, the first fixed layer having a respective static magnetic polarization, and a first spacer layer disposed between the first free layer and the first fixed layer. The system may also include a second magnetic latch comprising: a second free layer, the second free layer being capable of magnetic polarization using a second electrical input voltage, a second fixed layer, the second fixed layer having a respective static magnetic polarization, and a second spacer layer disposed between the second free layer and the second fixed layer. The system may also include an output element situated between the first magnetic latch and the second magnetic latch, the output element comprising: a magnetic biasing layer having a respective static magnetic polarization, a third free layer, the third free layer being capable of magnetic polarization via magnetic induction caused by at least one of: the magnetic polarization of the first free layer, the magnetic polarization of the second free layer, or the static magnetic polarization of the magnetic biasing layer, wherein the magnetic biasing layer is proximate to the third free layer, a third fixed layer, the third fixed layer having a respective static magnetic polarization, and a third spacer layer disposed between (i) the combination of the third free layer and the magnetic biasing layer and (ii) the third fixed layer.

The details of one or more examples are set forth in the accompanying drawings and the description below. Other features, objects, and advantages will be apparent from the description and drawings, and from the claims.

DETAILED DESCRIPTION

Techniques of the present disclosure may provide a latching element with lowered power consumption, improved system recovery, and higher fault tolerance. By taking advantage of interfacial spin-dependent scattering and angular momentum transfer to achieve low-energy and low-power spin-polarized current writing, the magnetic latching element described herein may provide non-volatile data latching with high areal density, low energy writing, low power consumption, and high reliability. Furthermore, the techniques described herein may enable rad-hard and rad-soft CMOS latches. The magnetic latching element may be capable of storing both a binary level and its compliment in a single structure. Determining the stored levels may be accomplished, in various examples, using magneto-resistive feedback based on tunneling magneto-resistance, giant magneto-resistance, or other read effects. In other words, the magnetic latching element described herein may, in some examples, be capable as functioning as a D latch.

Figure 1:
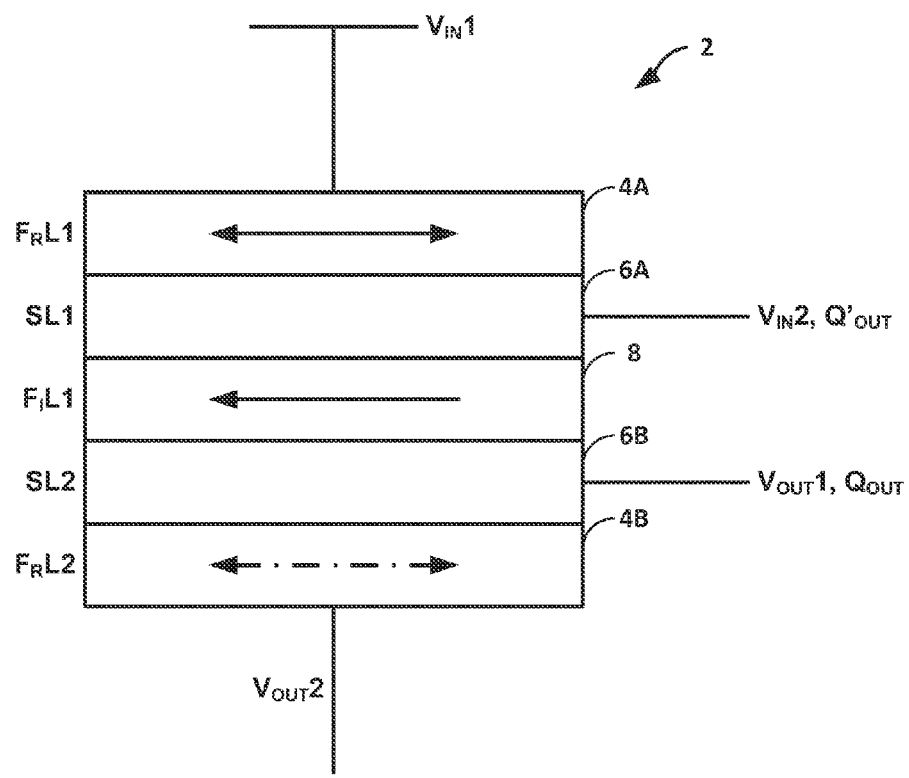
FIG. 1 is a block diagram illustrating a side view of one example of a magnetic latching element in accordance with one or more techniques of the present disclosure.

FIG. 1 is a block diagram illustrating a side view of one example of a magnetic latching element 2 in accordance with one or more techniques of the present disclosure. As shown in the example of FIG. 1, latching element 2 consists of a five-layer stack structure.

In the example of FIG. 1, latching element 2 includes ferromagnetic free layers 4A and 4B (collectively "free layers 4") as outer layers (or structures). Free layers 4 are "free" in that each of free layers 4 may be magnetized with various polarities. That is, the magnetic polarity of free layers 4 is modifiable and not fixed. In the example of FIG. 1, for instance, each of free layers 4 may be magnetized to the left or to the right, as evidenced by the two-way arrows. In various examples, free layers 4 may be magnetized in other directions, such as up, down, into the page, out of the page, or any other direction within three dimensional space.

Latching element 2, in the example of FIG. 1, includes fixed layer 8 as a central layer (or structure). Fixed layer 8 is "fixed" in that the magnetic polarity of fixed layer 8 remains fixed throughout operation. That is, fixed layer 8 may serve as the pinned, reference layer for each of free layers 4. In the example of FIG. 1, for instance, fixed layer 8 may be magnetized to the left, as evidenced by the one-way arrow. In other examples, however, fixed layer 8 may be magnetized in another direction.

Free layers 4 and/or fixed layer 8 may be made of any suitable ferromagnetic material, such as a nickel-iron alloy (NiFe), a cobalt-iron alloy (CoFe), a cobalt-iron-boron alloy (CoFeB), or others. Any suitable thickness may be used for free layers 4 and/or fixed layer 8, such as a thickness of several nanometers, a thickness of less than a nanometer, or other thickness. The pinning material for free layers 4 and/or fixed layer 8 may be a manganese alloy, such as a platinum-manganese alloy (PtMn), a nickel-manganese alloy (NiMn), iridium-manganese alloy (IrMn), or other alloy, with a thickness that could be greater than one nanometer. The material for fixed layer 8 may, in some examples, be chosen to optimize the stability of the orientation of the magnetization and the generation of spin-polarized currents. The material for free layers 4 may be chosen to optimize spin transfer.

Between fixed layer 8 and each of free layers 4, latching element 2 includes spacer layers 6A and 6B (collectively, "spacer layers 6"). Spacer layers 6 may be layers (or structures) on either side of fixed layer 8 that serve to separate fixed layer 8 from free layers 4. Each of spacer layers 6 may be made of any suitable non-magnetic material, such as aluminum oxide (AlOx) or magnesium oxide (MgO) (e.g., in the case of tunneling barriers) or copper, aluminum, or Tantalum (e.g., in the case of conductive spacer layers). Spacer layers 6 may have any suitable thicknesses (e.g., more than, equal to, or less than one nanometer).

As shown in the example of FIG. 1, free layer 4A is attached to a first input voltage, $V_{IN}1$, and spacer layer 6A is attached to a second input voltage, $V_{IN}2$. Spacer layer 6B is attached to a first output voltage, $V_{OUT}1$, and free layer 4B is attached to a second output voltage, $V_{OUT}2$. By applying different voltages as inputs at $V_{IN}1$, $V_{IN}2$, $V_{OUT}1$, and $V_{OUT}2$, latching element 2 may be used to store and retrieve information by exploiting interfacial spin-dependent scattering.

Interfacial spin-dependent scattering, described simply, provides that a current from a positive-polarity voltage applied across a free layer/spacer layer/fixed layer combination would magnetize the free layer in a particular direction, while a current from a negative-polarity voltage applied across the same combination would magnetize the free layer in a direction opposite of the particular direction. Thus, in the example of FIG. 1, applying a sufficiently high positive voltage across V1 (e.g., $V_{IN}1-V_{OUT}1>0$) would result in free layer 4A being magnetized in one direction (e.g., to the right), while applying a sufficiently high negative voltage across V1 (e.g., $V_{IN}1-V_{OUT}1<0$) would result in free layer 4A being magnetized in the opposite direction (e.g., to the left). Similarly, applying a sufficiently high positive voltage across V2 would result in free layer 4B being magnetized in one direction while applying a sufficiently high negative voltage across V2 would result in free layer 4B being magnetized in the opposite direction.

Furthermore, because the polarity of V1 and V2 are opposite, the same voltage across both V1 and V2 would polarize free layers 4 in opposite directions. That is, V1 runs from free layer 4A to spacer layer 6B whereas V2 runs from spacer layer 6A to free layer 4B. Thus a sufficiently high positive voltage across both would magnetize free layer 4A with a polarity directed one way (e.g., to the left) and free layer 4B with a polarity directed the opposite way (e.g., to the right). This is illustrated in the example of FIG. 1 using the dashed double-headed arrow in free layer 4B, compared to the solid double-headed arrow in free layer 4A. Thus, in addition to storing data (e.g., a binary value), latching element 2 may be operable to store the complement of the data as well (e.g., the opposite value).

In the example of FIG. 1, data stored in latching element 2 may be read by applying a voltage across V1 or V2 and measuring the resistance state of free layer 4A or free layer 4B, respectively. In general, the voltages applied to read data stored by latching element 2 may be substantially lower than the voltages applied to write data. That is, read voltages may be sufficiently small enough that the magnetic polarity of free layers 4 may not be substantially changed by the applied read voltages.

As a result of tunnel magneto-resistance (TMR) and/or giant magneto-resistance (GMR), when a read voltage is applied across V1 and/or V2, the respective output current at $Q_{OUT}$ and/or $Q'_{OUT}$ will vary based on the data stored by latching element 2. For example, when free layer 4A is magnetically polarized in a direction (e.g., to the right) that is anti-parallel to the direction (e.g., to the left) in which fixed layer 8 is magnetically polarized, spacer layer 6A may exhibit relatively higher resistance to a current passing through it. Thus, when a read voltage is applied across V1, the current at $Q_{OUT}$ may be relatively lower. In some examples, this lower current at the output (e.g., $Q_{OUT}$) may represent a "low" value, such as a binary 0, or a "false." When free layer 4A and fixed layer 8 are magnetically polarized in parallel directions (e.g., to the left), spacer layer 6A may exhibit relatively lower resistance. Thus, when the read voltage is applied across V1, the current at $Q_{OUT}$ may be relatively higher. The higher current at $Q_{OUT}$ may, in some examples, represent a "high" value, such as a binary 1, or a "true." In a similar fashion, if free layer 4B is magnetically polarized in a direction anti-parallel to the direction in which fixed layer 8 is magnetically polarized, spacer layer 6B may exhibit relatively higher resistance. Thus, applying a read voltage across V2 may result in a relatively lower current and the complement value, $Q'_{OUT}$, may be read as a binary 0. If free layer 4B is magnetically polarized in a direction parallel to the direction in which fixed layer 8 is magnetically polarized, spacer layer 6B may exhibit relatively lower resistance, applying the read voltage across V2 may result in a relatively higher current, and $Q'_{OUT}$ may be read as a binary 0. While described with respect to FIG. 1 as representing binary 0 and binary 1, respectively, the relatively higher resistance and lower resistance of an output may, in other examples, represent binary 1 and binary 0, respectively.

That is, the meaning of the resistance characteristics of spacer layers 6 may be defined in various ways in different instances.

By using input currents to change the resistance characteristics of spacer layer 6A and/or spacer layer 6B, the techniques of the present disclosure provide magnetic latching element 2 that is operable to store or latch data and its compliment based on spin-polarized current and/or spin-transfer phenomena. Furthermore, the techniques described herein enable magnetic latching element 2 to support readback functionality based on TMR and/or GMR phenomena. By leveraging such principles, magnetic latching elements such as latching element 2 may provide CMOS functionality with low energy and low power consumption (including non-volatility) as well as high areal density and high reliability. Thus, the techniques described herein may improve the reliability and performance of CMOS for lowered power consumption, system recovery purposes, and fault tolerance. Furthermore, the techniques of the present disclosure may enable the construction of magnetic logic by coupling two or more of the magnetic latch described herein together as D latches.

While shown in the example of FIG. 1 as using in-plane magnetization, structures may, in various examples, be based on out-of-plane magnetization or other suitable techniques. Furthermore, spacer layers may be tunnel barriers that exhibit tunneling magneto-resistance, non-magnetic metal layers that exhibit giant magneto-resistance, or other suitable materials. For instance, spacer layers may be insulators thin enough that electrons can tunnel from an adjacent free layer, through the spacer layer, and to an adjacent fixed layer, or vice versa. If the magnetic polarizations of the fixed layer and free layer are parallel it may be more likely that electrons will tunnel through the spacer layer than if they are antiparallel. Consequently, the spacer layer can be "switched" between two states of electrical resistance, one with low and one with very high resistance. As another example, spacer layers may be a non-magnetic, but conductive material that vastly changes its resistance when subjected to a magnetic field.

In some examples, transistors, such as CMOS devices, may be used to control the states of magnetic latching elements, and support access functions. The structures and techniques described herein may, in various examples, be embedded or used with integrated and/or monolithic magnetics and silicon (e.g., CMOS) technologies.

Figure 2:
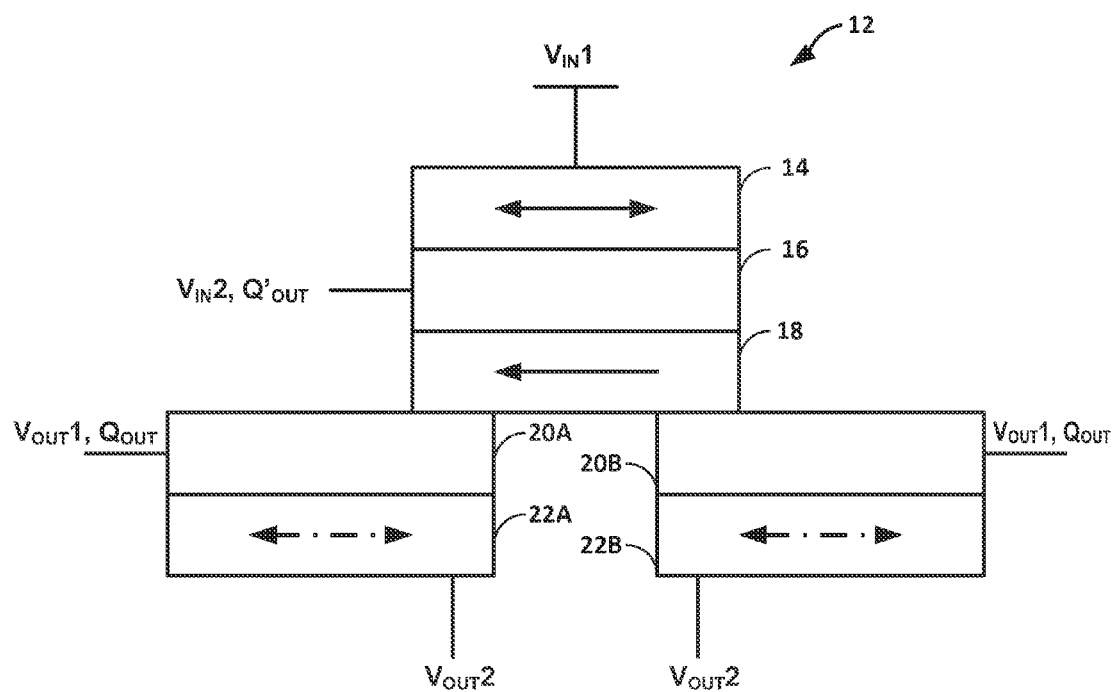
FIG. 2 is a block diagram illustrating a side view of another example of a magnetic latching element in accordance with one or more techniques of the present disclosure.

FIG. 2 is a block diagram illustrating a side view of another example of a magnetic latching element 12 in accordance with one or more techniques of the present disclosure. Latching element 12 includes a separated lower spacer layer and lower free layer, which may enable latching element 12 to take a single input and produce a plurality of outputs, beyond a single output.

As shown in the example of FIG. 2, latching element 12 includes ferromagnetic free layer 14 as a top layer (or structure) and ferromagnetic free layer 22 (including a first portion 22A and a second portion 22B) as a bottom layer (or structure). Similar to free layers 4 of FIG. 1, free layers 14 and 22 are "free" in that each may be magnetized with various polarities. That is, the magnetic polarity of each of free layers 14 and 22 is modifiable and not fixed, as evidenced by the two-way arrows shown in FIG. 2. Though the two-way arrows in FIG. 2 point left and right, free layers 14 and 22 may, in various examples, be magnetized in other directions, such as up, down, into the page, out of the page, or any other direction.

Latching element 12, in the example of FIG. 2, includes fixed layer 18 as a central layer (or structure). Similar to fixed layer 8 of FIG. 1, fixed layer 18 is "fixed" in that the magnetic polarity of fixed layer 18 remains fixed throughout operation, as evidenced by the one-way arrow shown in FIG. 2. That is, fixed layer 18 may serve as the pinned, reference layer for each of free layers 14 and 22. Free layers 14, 22, and/or fixed layer 18 may be made of any suitable ferromagnetic material in accordance with the techniques described herein.

Between fixed layer 18 and each of free layers 14 and 22, latching element 12 includes spacer layer 16 and spacer layer 20 (including a first portion 20A and a second portion 20B). Spacer layers 16 and 20 may be layers (or structures) on either side of fixed layer 18 that serve to separate fixed layer 18 from free layers 14 and 22. Each of spacer layers 16 and 20 may be made of any suitable non-magnetic material in accordance with the techniques described herein.

As shown in the example of FIG. 2, layers 20 and 22 are each separated into two portions. In the example of FIG. 2, the first portions of each of these layers (e.g., portion 20A and 22A) are not contiguous with the second portions of each of these layers (e.g., portion 20B and 22B). That is, portion 20A is not touching portion 20B and portion 22A is not touching portion 22B. Thus, layers 14, 16, and 18 may be coextensive with one another (e.g., disposed vertically one on top of the other, with flush sides), the first portions of layers 20 and 22 may be coextensive with one another, and the second portions of layers 20 and 22 may be coextensive with one another, but layers 14, 16, and 18 may not be coextensive with either portions of layers 20 and 22.

The separation of layers 20 and 22, as shown in latching element 12, may enable routing and implementing additional and/or more complex logic functions based on an initial input. That is, a single input may be used to achieve one or more outputs to allow distributing the signal in one or more paths. This ability may enable the construction of logic gates and logic device fanout.

While shown in the example of FIG. 2 as being not contiguous, the first portions of layers 20 and 22 may, in some examples, be contiguous with second portions of layers 20 and 22. While separated into two portions in the example of FIG. 2, layers 20 and 22 may, in other examples, be separated into any number of portions (e.g., three portions, four portions, etc.). Furthermore, in some examples, layers 14 and 16 may additionally or alternatively be split into separate portions.

Figure 3:
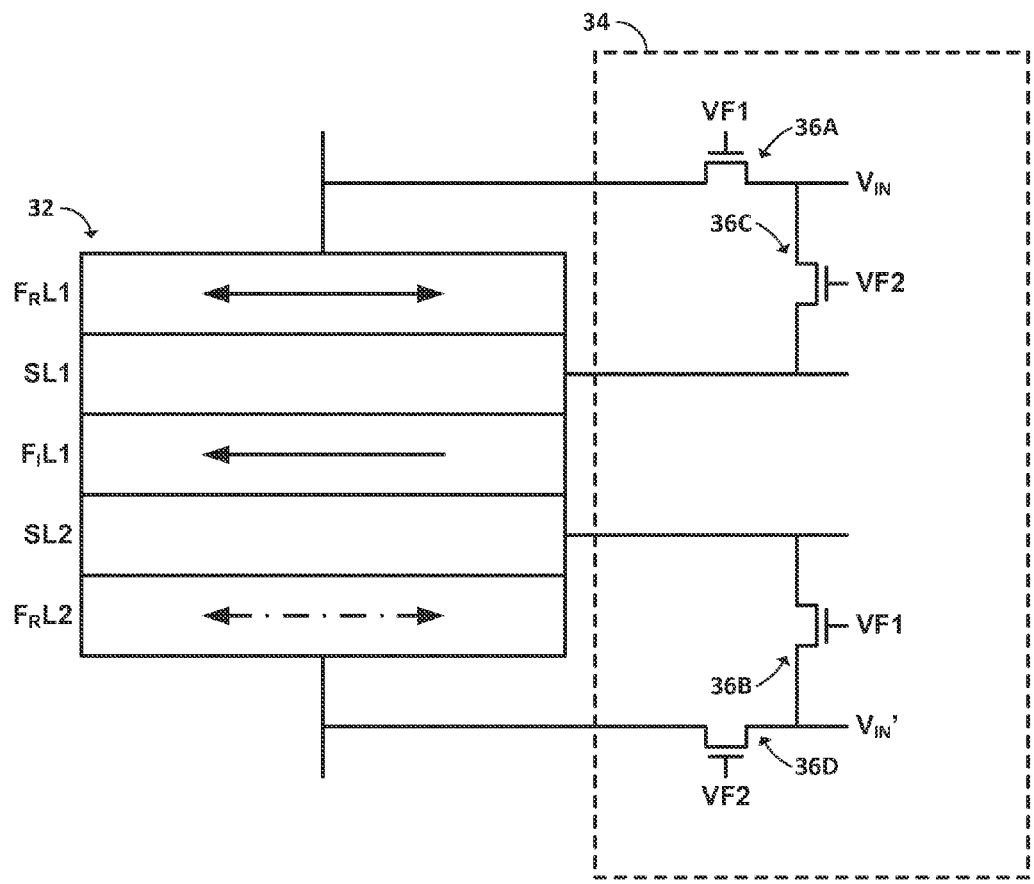
FIG. 3 is a block diagram illustrating an example magnetic latching element and associated logic in accordance with one or more techniques of the present disclosure.

FIG. 3 is a block diagram illustrating an example magnetic latching element 32 and associated logic 34 in accordance with one or more techniques of the present disclosure. In the example of FIG. 3, latching element 32 may have structure and function substantially similar to that of latching element 2 described in the context of FIG. 1. That is, latching element 32 may include a first and second free layer, a first and second spacer layer, and a fixed layer and may be operable, via a first current and/or second current, to store a binary value and a compliment of the binary value and support readback of the binary value and/or the compliment.

In the example of FIG. 3, logic 34 includes transistors 36A-36D (collectively, "transistors 36"). Transistors 36 may act as switches to control current flow to latching element 32. Using transistors 36, $V_{IN}$ and $V_{IN}'$ may provide the polarity and voltage to be input to latching element 32, while voltage VF1 and voltage VF2 may select which of the currents will be inputted. In other words, transistors 36 may determine whether the input, $V_{IN}-V_{IN}'$, will provide the first current or the second current for latching element 32. Transistors 36 may represent any type of transistor, such as metal-oxide-semiconductor field effect transistors (MOSFETs) or other field effect transistors (FETs), bipolar junction transistors, or other switching logic elements.

As shown in the example of FIG. 3, one end of transistor 36A (e.g., the drain) is connected to the input $V_{IN}$, and the other end of transistor 36A (e.g., the source) is connected to the first free layer of latching element 32. One end of transistor 36B (e.g., the drain) is connected to the second spacer layer of latching element 32, and the other end of transistor 36B (e.g., the source) is connected to the input $V_{IN}'$. Both transistor 36A and transistor 36B may be switched using VF1.

One end of transistor 36C (e.g., the drain), in the example of FIG. 3, is connected to the input $V_{IN}$, and the other end of transistor 36C (e.g., the source) is connected to the first spacer layer of latching element 32. One end of transistor 36D (e.g., the drain) is connected to the second free layer of latching element 32, and the other end of transistor 36D (e.g., the source) is connected to the input $V_{IN}'$. Both transistor 36C and transistor 36D may be switched using VF2.

Alternatively switching on transistors 36A and 36B or transistors 36C and 36D may allow an input voltage, $V_{IN}-N_{IN}'$, to be applied from $F_RL1$ to SL2, or from SL1 to $F_RL2$, respectively. In some examples, applying a sufficiently strong input voltage while transistors 36A and 36B (or transistors 36C and 36D) are switched on may cause the first free layer (or second free layer) of latching element 32 to be magnetically polarized in accordance with the techniques described herein. Thus, by maintaining the same input voltage, $V_{IN}-V_{IN}'$, while switching transistors 36A and 36B on and off then switching transistors 36C and 36D on and off, latching element 32 may store a value and its compliment.

In the example of FIG. 3, the input voltage $V_{IN}-V_{IN}'$ may also be used to read values stored by latching element 32. For instance, applying a control signal to both VF1 inputs (e.g., activating transistors 36A and 36B), with the VF2 inputs deactivated (e.g., transistors 36C and 36D being inactive), may allow for reading of the value represented by the magnetic polarity of $F_RL1$. If $F_RL1$ and $F_IL1$ have parallel magnetic polarization, SL1 presents a relatively lower resistance to the read current while if $F_RL1$ and $F_IL1$ have anti-parallel magnetic polarization, SL1 presents a relatively higher resistance to the read current.

Similarly, applying a control signal to both VF2 inputs, with the VF1 inputs deactivated, may allow for reading of the value represented by the magnetic polarity of $F_RL2$. If $F_RL2$ and $F_IL1$ have parallel magnetic polarization, the resulting resistance of SL2 experienced by the read current is relatively low, while if $F_RL2$ and $F_IL1$ have anti-parallel magnetic polarization, the resulting resistance of SL2 experienced by the read current is relatively high.

Figure 4:
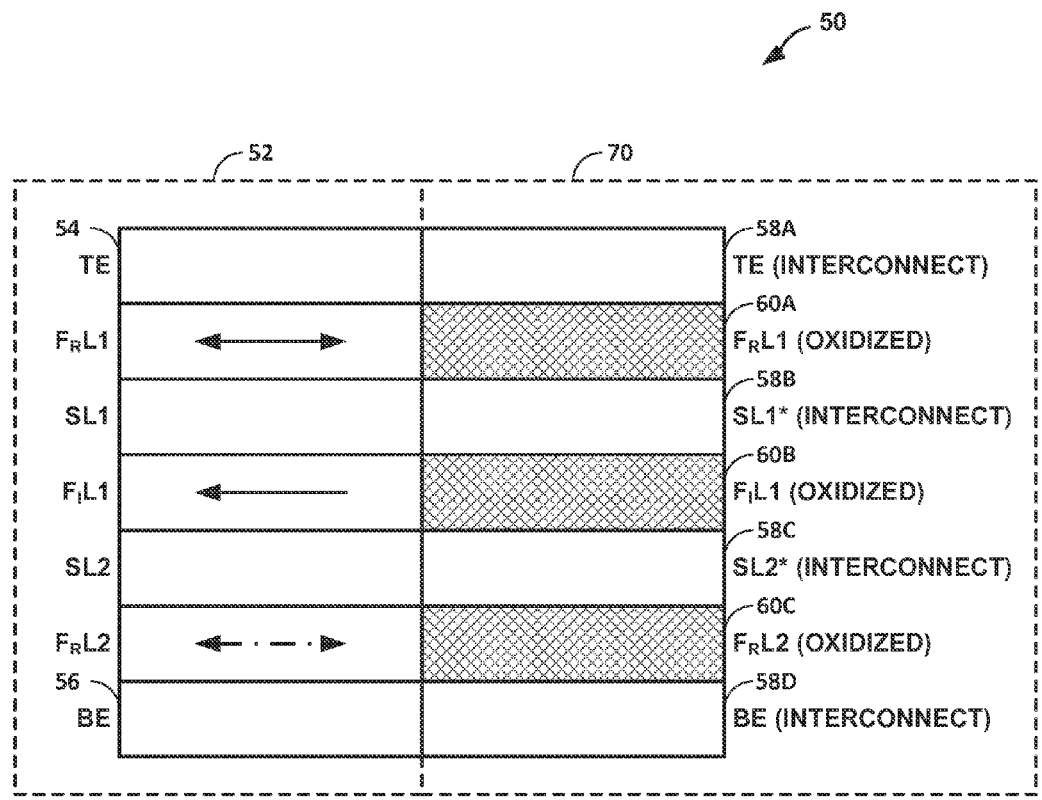
FIG. 4 is a block diagram illustrating a side view of an example system in accordance with one or more techniques of the present disclosure.

FIG. 4 is a block diagram illustrating a side view of an example system 50 in accordance with one or more techniques of the present disclosure. System 50 includes magnetic latching element 52 and support structure 70. In some examples, system 50 may include additional instances of latching element 52 and/or support structure 70.

In the example of FIG. 4, latching element 52 may have structure and function substantially similar to that of latching element 2 described in the context of FIG. 1. That is, latching element 32 may include a first and second free layer, a first and second spacer layer, and a fixed layer and may be operable, via a first current and/or second current, to store a binary value and a compliment of the binary value and support readback of the binary value and/or the compliment. As shown in the example of FIG. 4, latching element 52 also includes a top electrode layer 54 and a bottom electrode layer 56. Layers 54 and 56 may provide the necessary connections through which the first and second currents may flow.

Support structure 70, as shown in the example of FIG. 4, is a multi-layer structure connected to latching element 52 that provides interconnect layers 58A-58D (collectively, "interconnect layers 58") for various layers of latching element 52, as well as isolation layers 60A-60C (collectively, "isolation layers 60") that serve to isolate various layers of latching element 52. In some examples, isolation layers 60 may be formed by oxidizing the layers as further described in FIG. 7, below. Support structure 70 may be connected to multiple instances of latching element 52, and may allow some interaction between the instances, via interconnect layers 58, while not allowing other interaction between the instances, via isolation layers 60.

By interconnecting the electrode layers and spacer layers of two magnetic latching elements together, support structure 70 may enable data stored in one magnetic latching element (e.g., latching element 52) to be propagated to another latching element, thereby effectively allowing for cascading logic using the magnetic latching element described herein.

For instance, latching element 52, as shown in the example of FIG. 4, may use support structure 70 to serve as interconnect metallization. Note that isolation layers 60 may provide a higher resistance, while interconnect layers 58 may provide a lower resistance. This may allow conduction to occur in adjacent layers while isolating interconnect layers from each other. Support structure 70, as shown in the example of FIG. 4, may enable latching elements (e.g., various instances of latching element 52) to making contact with and propagate signals to and from one another. This interconnection may also enable routing of signals from latching element 52 to control circuitry and/or to other logic devices. As an example, another latching element (e.g., an instance of latching element 52) may be placed to the right of support structure 70 such that the magnetic fields from latching element 52 (e.g., the fields of $F_RL1$, $F_RL2$, and/or possibly $F_IL1$) influence fields of the corresponding structures of the second latching element. Such a configuration would enable magnetic coupling, if desired, to support signal propagation, such as for routing and logic purposes.

While only a single instance of latching element 52 and a single instance of support structure 70 are shown in FIG. 4, system 50 may be scalable to include a large number of latching elements connected via respective support structures. Additionally, though described with respect to FIG. 4 as separate structures, various instances of latching element 52 and support structure 70 may, in some examples, be fabricated as a single device, as explained with respect to FIG. 7, below.

Figure 5:
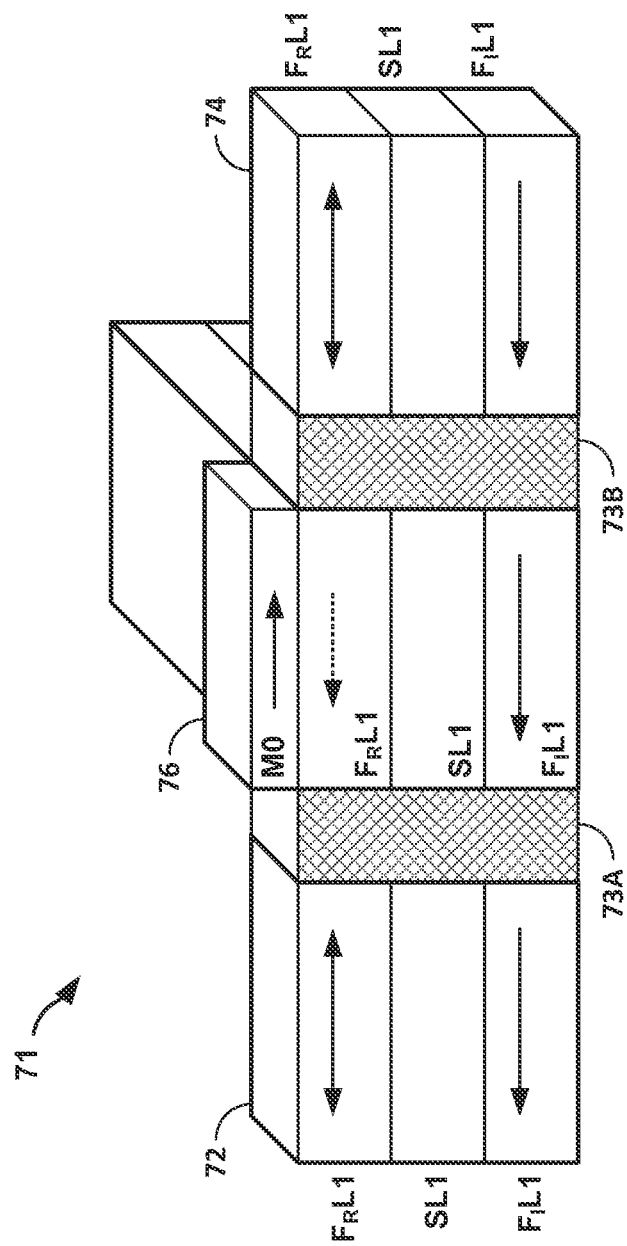
FIG. 5 is a block diagram illustrating an example system for logic using magnetic latching elements in accordance with one or more techniques of the present disclosure.

FIG. 5 is a block diagram illustrating an example system 71 for logic using magnetic latching elements in accordance with one or more techniques of the present disclosure. System 71 may be operable to receive two binary inputs and provide a binary output that indicates whether the two inputs are both high. That is, system 71 may operate as an AND gate.

System 71, as shown in the example of FIG. 5, includes magnetic latching elements 72, 74, and output element 76. Each of latching elements 72, 74 includes a first free layer ($F_RL1$), a first spacer layer (SL1), and a fixed layer ($F_IL1$). In some examples, latching elements 72, 74 may include additional layers, such as a second spacer layer and a second free layer. That is, while shown in the example of FIG. 5 as having only 3 layers, latching elements 72, 74 may, in other examples, be composed of more layers, similar to latching element 2 of FIG. 1.

Output element 76, as shown in the example of FIG. 5, includes a first free layer ($F_RL1$), a first spacer layer (SL1), and a fixed layer ($F_IL1$). Output element 76 also includes a magnetic biasing layer (M0). While shown in the example of FIG. 5 as being above the first free layer of output element 76, the magnetic biasing layer of output element 76 may, in other examples, be below the first free layer (e.g., between the first free layer and the first spacer layer). While shown in the example of FIG. 5 as including only 4 layers, output element 76 may, in some examples, include additional or different layers. For instance, output element 76 may include a second spacer layer below the fixed layer, a second free layer below the second spacer layer, and a second magnetic biasing layer below the second free layer or between the second free layer and the second spacer layer.

In the example of FIG. 5, latching element 72 is connected to output element 76 via support structure 73A and latching element 74 is connected to output element 76 via support structure 73B. Support structures 73A and 73B (collectively, "support structures 73") may, in some examples, each be an instance of support structure 70 as described in the example of FIG. 4. This may be the case when spacer layer 1 of latching elements 72, 74 exhibit giant magnetoresistance. In other examples, support structures 73 may be a different support structure. For instance, each of support structures 73 may, in some examples, be a single, magnetically permeable, electric insulator. That is, support structures 73 may inhibit electrical signals from passing between latching elements 72, 74 and output element 76, but may not inhibit magnetic coupling of latching elements 72, 74 with output element 76. This may be the case when spacer layer 1 of latching elements 72, 74 exhibit tunneling magnetoresistance.

The fixed layers of latching elements 72, 74 and output element 76 may be a permanent magnet having a magnetic polarity pointing in a first direction as shown by the single-headed arrows (e.g., to the left). The first free layers of latching elements 72, 74 may be magnetically polarized, using the effects of spin transfer torque, in a direction either parallel to that of the respective fixed layer, or antiparallel to that of the respective fixed layer, as shown by the double-headed arrows (e.g., to the left and right). The magnetic biasing layer of output element 76 may be a small permanent magnet layer having a magnetic polarization in a direction antiparallel to that of the fixed layer of output element 76, as shown by the single-headed arrow (e.g., to the right). The polarization of the thing magnetic biasing layer next to the first free layer of output element 76 may serve to induce a small magnetic polarization in the first free layer of output element 76 having a direction parallel to the magnetic polarization of the fixed layer of output element 76, as shown by the single-headed dotted arrow (e.g., to the left). The first free layer of output element 76, however, may be capable of magnetic polarization similar to the free layers of latching elements 72, 74.

In accordance with the techniques described herein, latching elements 72, 74 may each be configured to receive a respective input voltage across the respective first free layer, first spacer layer, and fixed layer. As a result of the respective input voltage, the respective first free layer of latching elements 72 may be polarized either parallel to the polarization of the respective fixed layer (e.g., to the left), or antiparallel to the polarization of the respective fixed layer (e.g., to the right). For instance, if the respective input voltage is positive, the respective first free layer may be polarized parallel to the respective fixed layer. If the respective input voltage is negative, the respective first free layer may be polarized antiparallel to the respective fixed layer.

In the example of FIG. 5, the polarization of the respective first free layers of latching elements 72, 74 may affect the polarization of the first free layer of output element 76 via magnetic induction. That is, because support structures 73 do not interfere substantially with the magnetic fields produced by the respective first free layers of latching elements 72, 74, the magnetic polarization of the respective first free layers of latching elements 72, 74 may result in a change to the magnetic polarization of the first free layer of output element 76. Generally, polarizing one of the first free layers of latching elements 72, 74 either toward output element 76 or away from output element 76 (e.g., to the left or to the right) will cause the first free layer of output element 76 to experience polarizing effects in the same direction. However, as a result of the magnetic biasing layer, the first free layer of output element 76 may need to overcome the magnetic polarization bias in order to be polarized in a direction antiparallel to the direction in which the fixed layer of output element 76 is polarized.

Polarizing both of the first free layers of latching elements 72, 74 in a direction parallel to the fixed layers (e.g., to the left) may increase the polarization of output element 76's first free layer to the left. Polarizing only one of the first free layers of latching elements 72, 74 (e.g., the first free layer of latching element 72) in a direction antiparallel to the fixed layers (e.g., to the right), while polarizing the other first free layer of latching elements 72, 74 (e.g., the first free layer of latching element 74) in a direction parallel to the fixed layers (e.g., to the left), may have no effect on the polarization of output element 76's first free layer or may decrease the polarization of output element 76's first free layer to the left, but may not be enough to overcome the biasing polarization of the first free layer of output element 76. That is, the biasing polarization of the first free layer of output element 76 resulting from the biasing layer may be sufficiently large that the opposing induction caused by a single first free layer of one of latching elements 72, 74 may be unable to overcome the biasing polarization. Thus, the first free layer of output element 76 may retain a polarization parallel to that of the fixed layers (e.g., to the left). Only polarizing both of the first free layers of latching elements 72, 74 may cause magnetic induction substantial enough to overcome the biasing polarization and to polarize the first free layer of output element 76 in a direction antiparallel to the fixed layers (e.g., to the right). In other words, only if both the first free layers of latching elements 72, 74 are polarized antiparallel to the respective fixed layers will the first free layer of output element 76 be polarized antiparallel to the respective fixed layer. Thus, in the example of FIG. 5, a polarization of a respective first free layer in a direction antiparallel to the direction in which the respective fixed layer is polarized may represent a "high" value or binary 1, while polarization of a respective first free layer in a direction parallel to that of the respective fixed layer may represent a "low" value or binary 0 and system 71 may function as an AND gate.

In some examples, the output of system 71 may be determined by applying a read voltage across the first free layer, the first spacer layer, and the fixed layer of output element 76. The output current received from the first fixed layer of output element 76 may indicate a resistance characteristic of the first spacer layer of output element 76. For instance, if the first free layer of output element 76 is polarized parallel to the fixed layer of output element 76, the output current may be different than if the first fixed layer were polarized antiparallel to the fixed layer.

In some examples, the output of system 71 may be used as an input to other magnetic logic. For instance, as shown in the example of FIG. 5, the first fixed layer, the first spacer layer, and the fixed layer of output element 76 may extend further than latching elements 72, 74 and support structures 73. Though not shown in the example of FIG. 5, the magnetic biasing layer of output element 76 may, in some examples, extend further as well. The extended layers of output element 76 may be configured as part of another logic gate, such as an additional AND gate or an OR gate, in accordance with the techniques described herein.

Figure 6:
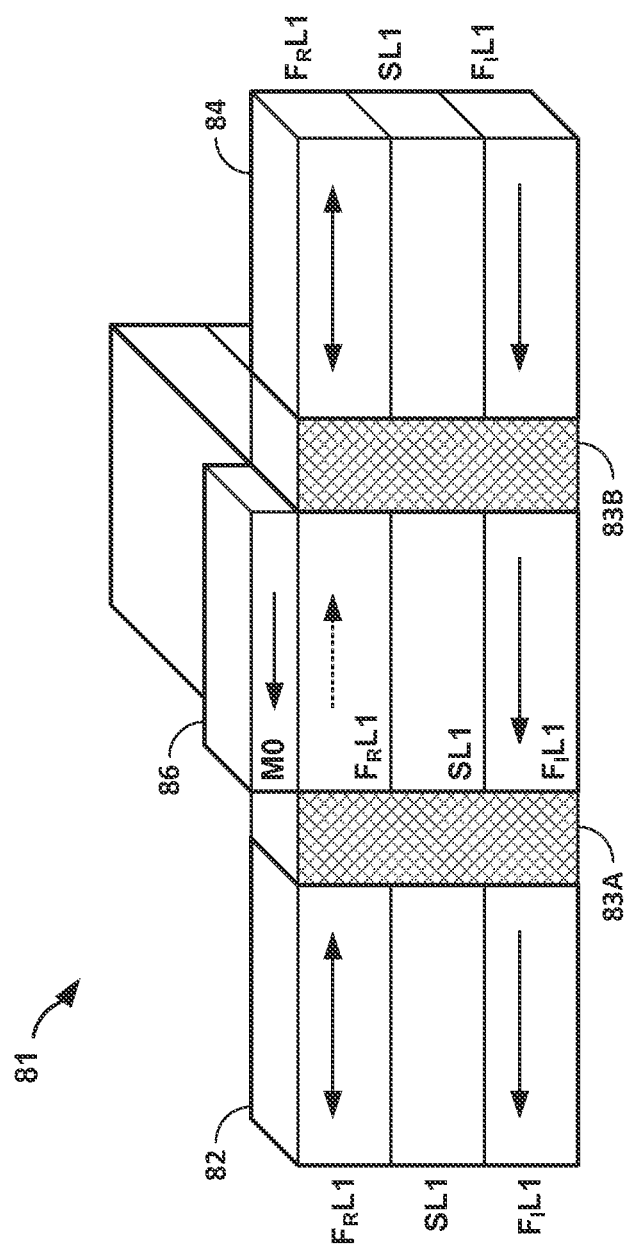
FIG. 6 is a block diagram illustrating an example system for logic using magnetic latching elements in accordance with one or more techniques of the present disclosure.

FIG. 6 is a block diagram illustrating an example system 81 for logic using magnetic latching elements in accordance with one or more techniques of the present disclosure. System 81 may be operable to receive two binary inputs and provide a binary output that indicates whether at least one of the two inputs is high. That is, system 81 may operate as an OR gate.

System 81, as shown in the example of FIG. 6, includes magnetic latching elements 82, 84, and output element 86. Each of latching elements 82, 84 includes a first free layer (FRL1), a first spacer layer (SL1), and a fixed layer (FIL1). In some examples, latching elements 82, 84 may include additional layers, such as a second spacer layer and a second free layer. That is, while shown in the example of FIG. 6 as having only 3 layers, latching elements 82, 84 may, in other examples, be composed of more layers, similar to latching element 2 of FIG. 1.

Output element 86, as shown in the example of FIG. 6, includes a first free layer (FRL1), a first spacer layer (SL1), and a fixed layer (FIL1). Output element 86 also includes a magnetic biasing layer (M0). While shown in the example of FIG. 6 as being above the first free layer of output element 86, the magnetic biasing layer of output element 86 may, in other examples, be below the first free layer (e.g., between the first free layer and the first spacer layer). While shown in the example of FIG. 6 as including only 4 layers, output element 86 may, in some examples, include additional or different layers. For instance, output element 86 may include a second spacer layer below the fixed layer, a second free layer below the second spacer layer, and a second magnetic biasing layer below the second free layer or between the second free layer and the second spacer layer.

In the example of FIG. 6, latching element 82 is connected to output element 86 via support structure 83A and latching element 84 is connected to output element 86 via support structure 83B. Support structures 83A and 83B (collectively, "support structures 83") may, in some examples, each be an instance of support structure 80 as described in the example of FIG. 4. This may be the case when spacer layer 1 of latching elements 82, 84 exhibit giant magnetoresistance. In other examples, support structures 83 may be a different support structure. For instance, each of support structures 83 may, in some examples, be a single, magnetically permeable, electric insulator. That is, support structures 83 may inhibit electrical signals from passing between latching elements 82, 84 and output element 86, but may not inhibit magnetic coupling of latching elements 82, 84 with output element 86. This may be the case when spacer layer 1 of latching elements 82, 84 exhibit tunneling magnetoresistance.

The fixed layers of latching elements 82, 84 and output element 86 may be a permanent magnet having a magnetic polarity pointing in a first direction as shown by the single-headed arrows (e.g., to the left). The first free layers of latching elements 82, 84 may be magnetically polarized, using the effects of spin transfer torque, in a direction either parallel to that of the respective fixed layer, or antiparallel to that of the respective fixed layer, as shown by the double-headed arrows (e.g., to the left and right). The magnetic biasing layer of output element 86 may be a small permanent magnet layer having a magnetic polarization in a direction parallel to that of the fixed layer of output element 86, as shown by the single-headed arrow (e.g., to the left). The polarization of the thing magnetic biasing layer next to the first free layer of output element 86 may serve to induce a magnetic polarization in the first free layer of output element 86 having a direction antiparallel to the magnetic polarization of the fixed layer of output element 86, as shown by the single-headed dotted arrow (e.g., to the right). The first free layer of output element 86, however, may be capable of magnetic polarization similar to the free layers of latching elements 82, 84.

In accordance with the techniques described herein, latching elements 82, 84 may each be configured to receive a respective input voltage across the respective first free layer, first spacer layer, and fixed layer. As a result of the respective input voltage, the respective first free layer of latching elements 82 may be polarized either parallel to the polarization of the respective fixed layer (e.g., to the left), or antiparallel to the polarization of the respective fixed layer (e.g., to the right). For instance, if the respective input voltage is positive, the respective first free layer may be polarized parallel to the respective fixed layer. If the respective input voltage is negative, the respective first free layer may be polarized antiparallel to the respective fixed layer.

In the example of FIG. 6, the polarization of the respective first free layers of latching elements 82, 84 may affect the polarization of the first free layer of output element 86 via magnetic induction. That is, because support structures 83 do not interfere substantially with magnetic fields produced by the respective first free layers of latching elements 82, 84, the magnetic polarization of the respective first free layers of latching elements 82, 84 may result in a change to the magnetic polarization of the first free layer of output element 86. Generally, polarizing one of the first free layers of latching elements 82, 84 either toward output element 86 or away from output element 86 (e.g., to the left or to the right) will cause the first free layer of output element 86 to experience polarizing effects in the same direction. However, as a result of the magnetic biasing layer, the first free layer of output element 86 may need to overcome the magnetic polarization bias in order to be polarized in a direction parallel to the direction in which the fixed layer of output element 86 is polarized.

Polarizing both of the first free layers of latching elements 82, 84 in a direction antiparallel to the fixed layers (e.g., to the right) may increase the polarization of output element 86's first free layer to the right. Polarizing only one of the first free layers of latching elements 82, 84 (e.g., the first free layer of latching element 82) in a direction parallel to the fixed layers (e.g., to the left), while polarizing the other first free layer of latching elements 82, 84 (e.g., the first free layer of latching element 84) in a direction antiparallel to the fixed layers (e.g., to the right), may have no effect on the polarization of output element 86's first free layer or may decrease the polarization of output element 86's first free layer to the right, but may not be enough to overcome the biasing polarization of the first free layer of output element 86. That is, the biasing polarization of the first free layer of output element 86 resulting from the biasing layer may be sufficiently large that the opposing induction caused by a single first free layer of one of latching elements 82, 84 may be unable to overcome the biasing polarization. Thus, the first free layer of output element 86 may retain a polarization antiparallel to that of the fixed layers (e.g., to the right). Only polarizing both of the first free layers of latching elements 82, 84 may cause magnetic induction substantial enough to overcome the biasing polarization and to polarize the first free layer of output element 86 in a direction parallel to the fixed layers (e.g., to the left). In other words, only if both the first free layers of latching elements 82, 84 are polarized parallel to the respective fixed layers will the first free layer of output element 86 be polarized parallel to the respective fixed layer. Thus, in the example of FIG. 6, a polarization of a respective first free layer in a direction antiparallel to the direction in which the respective fixed layer is polarized may represent a "high" value or binary 1, while polarization of a respective first free layer in a direction parallel to that of the respective fixed layer may represent a "low" value or binary 0 and system 81 may function as an OR gate.

In some examples, the output of system 81 may be determined by applying a read voltage across the first free layer, the first spacer layer, and the fixed layer of output element 86. The output current received from the first fixed layer of output element 86 may indicate a resistance characteristic of the first spacer layer of output element 86. For instance, if the first free layer of output element 86 is polarized parallel to the fixed layer of output element 86, the output current may be different than if the first fixed layer were polarized antiparallel to the fixed layer.

In some examples, the output of system 81 may be used as an input to other magnetic logic. For instance, as shown in the example of FIG. 6, the first fixed layer, the first spacer layer, and the fixed layer of output element 86 may extend further than latching elements 82, 84 and support structures 83. Though not shown in the example of FIG. 6, the magnetic biasing layer of output element 86 may, in some examples, extend further as well. The extended layers of output element 86 may be configured as part of another logic gate, such as an AND gate or additional OR gate, in accordance with the techniques described herein.

By using the propagation of magnetic fields to create logic, the techniques described herein may enable more efficient energy use. Furthermore, the use of magnetic logic as described herein may prove more robust to radiation exposure, and therefore be useful in various rad-intensive applications, such as satellites or other systems intended for aviation or space.

Figure 7:
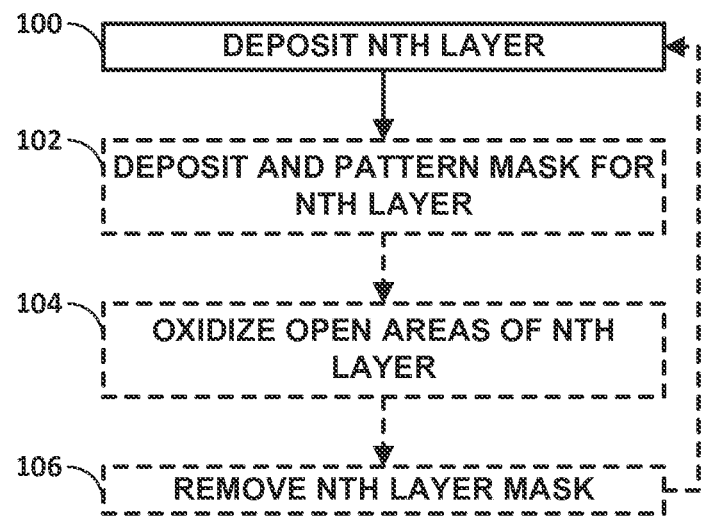
FIG. 7 is a flow diagram illustrating example operations for fabricating a magnetic latching element and associated support structure in accordance with one or more techniques of the present disclosure.

FIG. 7 is a flow diagram illustrating example operations for fabricating a magnetic latching element and associated support structure in accordance with one or more techniques of the present disclosure. For illustration purposes only, the example operations of FIG. 7 are described below within the context of FIG. 4.

In the example of FIG. 7, the fabrication process may begin with depositing a layer, such as the bottom electrode layer of latching element 52 (100). If the layer has a corresponding interconnect layer, then no further action may be required for the layer. The process may continue with depositing another layer, such as the second free layer of latching element 52.

If the layer has a corresponding oxidized layer, such as oxidized layer 60C corresponding to the second free layer of latching element 52, then the process may include depositing and patterning a mask for the layer (102). For instance, a mask may be placed over the second free layer, and a portion of the mask removed. The remaining exposed areas of the layer may be oxidized (104). The oxidization of the exposed areas may form the corresponding oxidized layer of support structure 70, such as oxidized layer 60C. After oxidization, the layer mask may be removed (106).

This process may continue for each of the second spacer layer, the fixed layer, the first spacer layer, the first free layer, and the top electrode layer, depositing one layer after another, while oxidizing a portion of the free layers and fixed layer. In this way, numerous latching elements and interconnecting support structures may be formed for use as low-power, radiation resistant, non-volatile storage or even magnetic logic.

Figure 8:
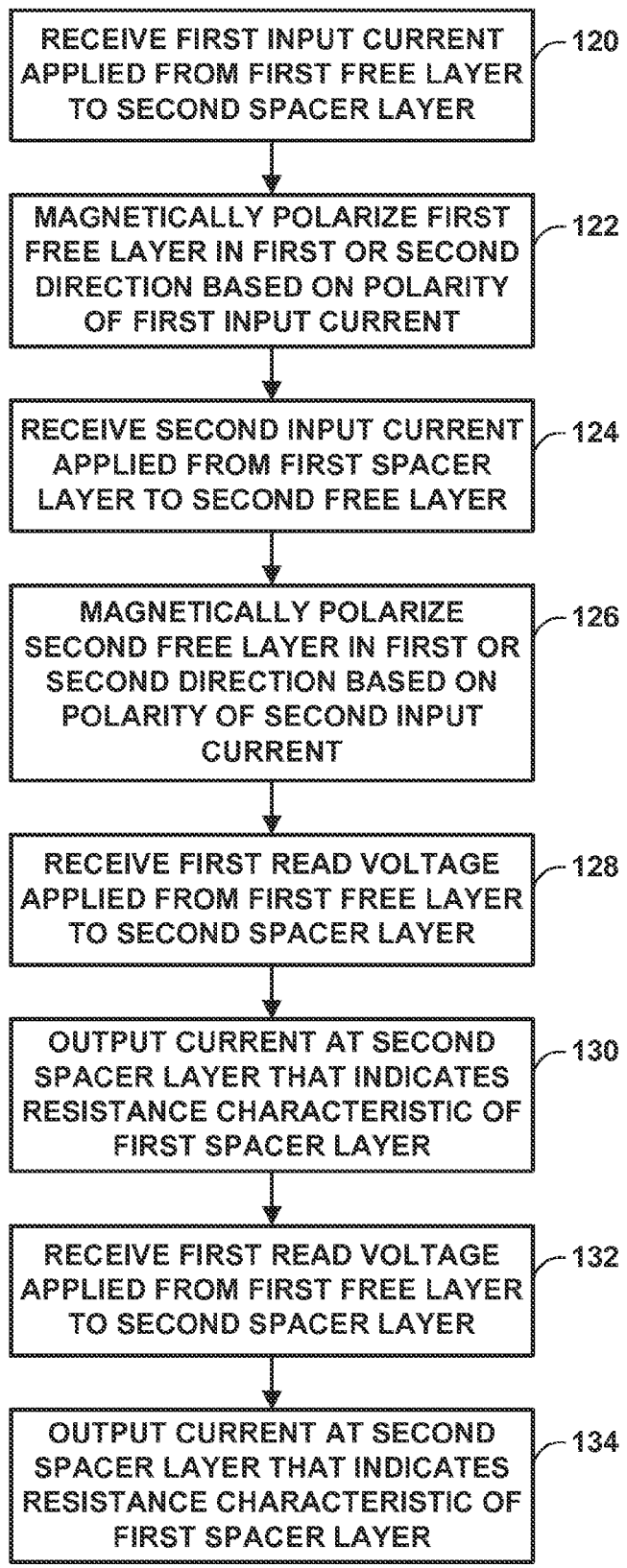
FIG. 8 is a flow diagram illustrating example operations performed by a magnetic latching element in accordance with one or more techniques of the present disclosure.

FIG. 8 is a flow diagram illustrating example operations performed by a magnetic latching element in accordance with one or more techniques of the present disclosure. For illustration purposes only, the example operations of FIG. 8 are described below within the context of FIG. 1.

In the example of FIG. 8, latching element 2 receives a first input current applied from free layer 4A to spacer layer 6B (120). Based on a polarity of the first input current, latching element 2 magnetically polarizes free layer 4A in either a first direction or a second direction, the second direction being opposite the first direction (122). For instance, if the polarity of the first input current is positive, latching element 2 may magnetically polarize free layer 4A in a direction anti-parallel to the direction in which fixed layer 8 is magnetically polarized. If, however, the polarity of the first input current is negative, latching element 2 may magnetically polarize free layer 4A in a direction parallel to the direction in which fixed layer 8 is magnetically polarized.

In the example of FIG. 8, latching element 2 receives a second input current applied from spacer layer 6A to free layer 4B (124). Based on a polarity of the second input current, latching element 2 magnetically polarizes free layer 4B in either the first direction or the second direction (126). For instance, if the polarity of the second input current is positive, latching element 2 may magnetically polarize free layer 4B in a direction parallel to the direction in which fixed layer 8 is magnetically polarized. If the polarity of the second input current is negative, latching element 2 may magnetically polarize free layer 4B in a direction anti-parallel to the direction in which fixed layer 8 is magnetically polarized.

Latching element 2, in the example of FIG. 8, receives a first read voltage applied from free layer 4A to spacer layer 6B (128). Responsive to receiving the first read voltage, latching element 2 may output a current at spacer layer 6B that indicates a resistance characteristic of spacer layer 6A (130). The resistance characteristic may be based on the magnetic polarity of free layer 4A. For instance, if free layer 4A is magnetically polarized in a direction anti-parallel to the direction in which fixed layer 8 is magnetically polarized, then spacer layer 6A may have a relatively higher resistance characteristic, and the output current at spacer layer 6B may be relatively lower. Conversely, if free layer 4A is magnetically polarized in a direction parallel to the direction in which fixed layer 8 is magnetically polarized, then spacer layer 4A may have a relatively lower resistance characteristic, and the output current at spacer layer 6B may be relatively higher.

In the example of FIG. 8, latching element 2 receives a second read voltage applied from spacer layer 6A to free layer 4B (132). Responsive to receiving the second read voltage, latching element 2 may output a current at spacer layer 6A that indicates a resistance characteristic of spacer layer 6B (134). The resistance characteristic may be based on the magnetic polarity of free layer 4B. For instance, if free layer 4B is magnetically polarized in a direction anti-parallel to the direction in which fixed layer 8 is magnetically polarized, then spacer layer 6B may have a relatively higher resistance characteristic, and the output current at spacer layer 6A may be relatively lower. Conversely, if free layer 4B is magnetically polarized in a direction parallel to the direction in which fixed layer 8 is magnetically polarized, then spacer layer 6B may have a relatively lower resistance characteristic, and the output current at spacer layer 6A may be relatively higher.

Various examples have been described. These and other examples are within the scope of the following claims.

What is claimed is:

1. A device comprising:
   a first free layer, the first free layer being capable of magnetic polarization using a first electrical current;
   a fixed layer, the fixed layer having a static magnetic polarization;
   a first spacer layer disposed between the first free layer and the fixed layer;

a second free layer, the second free layer being capable of magnetic polarization using a second electrical current; and a second spacer layer disposed between the second free layer and the fixed layer, wherein the device is operable, via, the first electrical current, to store a binary value, the binary value being represented by a resistance characteristic of the first spacer layer, and wherein the device is operable, via the second electrical current, to store a compliment of the binary value, the compliment being represented by a resistance characteristic of the second spacer layer.

2. The device of claim 1, wherein to store the binary value, the device is operable to magnetically polarize the first free layer in a first direction, and wherein to store the compliment, the device is operable to magnetically polarize the second free layer in a second direction, the second direction being opposite the first direction.

3. The device of claim 2, wherein the static magnetic polarization of the fixed layer is parallel to the first direction.

4. The device of claim 1, wherein the first electrical current flows into the first free layer, through the first spacer layer, through the fixed layer, and out of the second spacer layer, and wherein the second electrical current flows into the first spacer layer, through the fixed layer, through the through the second spacer layer, and out of the second free layer.

5. The device of claim 1, further comprising a top electrode connected to the first free layer and a bottom electrode connected to the second free layer.

6. The device of claim 1, further comprising:
transistor logic connected to the first free layer, the first spacer layer, the second spacer layer, and the second free layer,
wherein the transistor logic is operable via at least two inputs to select one of the first electrical current or the second electrical current and input the selected one of the first electrical current or the second electrical current.

7. The device of claim 1, wherein the first free layer, the first spacer layer, the fixed layer, the second spacer layer, and the second free layer are all coextensive with one another.

8. The device of claim 1,
wherein the second spacer layer comprises a first portion of the second spacer layer and a second portion of the second spacer layer, the first portion of the second spacer layer and the second portion of the second spacer layer being not contiguous, and
wherein the second free layer comprises a first portion of the second free layer and a second portion of the second free layer, the first portion of the second free layer being coextensive with the first portion of the second spacer layer and the second portion of the second free layer being coextensive with the second portion of the second spacer layer.

9. The device of claim 1, wherein the first spacer layer and the second spacer layer each comprises a tunnel barrier that exhibits tunneling magneto-resistance.

10. The device of claim 1, wherein the first spacer layer and the second spacer layer each comprises a non-magnetic metal that exhibits giant magneto-resistance.

11. A method comprising:
receiving a first electrical input current by a device comprising a first free layer capable of magnetic polarization, a fixed layer having a static magnetic polarization, a first spacer layer disposed between the first free layer and the fixed layer, a second free layer capable of magnetic polarization, and a second spacer layer disposed between the second free layer and the fixed layer, wherein the first electrical input current is applied from the first free layer to the second spacer layer; and
magnetically polarizing, by the device and based on a polarity of the first electrical input current, the first free layer in either a first direction or a second direction, the second direction being opposite the first direction.

12. The method of claim 11, wherein the static magnetic polarization of the fixed layer is parallel to the first direction.

13. The method of claim 11, wherein a resistance characteristic of the first spacer layer depends on whether the first free layer is magnetically polarized in the first direction or the second direction, the method further comprising:
receiving, by the device, a first read voltage applied from the first free layer to the second spacer layer; and
responsive to receiving the first read voltage, outputting, by the device and at the second spacer layer, a first electrical output current that indicates the resistance characteristic of the first spacer layer.

14. The method of claim 11, further comprising:
receiving, by the device, a second electrical input current, wherein the second electrical input current is applied from the first spacer layer to the second free layer; and
magnetically polarizing, by the device and based on a polarity of the second electrical input current, the second free layer in either the first direction or the second direction.

15. A system comprising:
a first magnetic latch, comprising:
a first free layer, the first free layer being capable of magnetic polarization using a first electrical input voltage,
a first fixed layer, the first fixed layer having a first static magnetic polarization, and
a first spacer layer disposed between the first free layer and the first fixed layer;
a second magnetic latch comprising:
a second free layer, the second free layer being capable of magnetic polarization using a second electrical input voltage,
a second fixed layer, the second fixed layer having a second static magnetic polarization, and
a second spacer layer disposed between the second free layer and the second fixed layer; and
an output element situated between the first magnetic latch and the second magnetic latch, the output element comprising:
a magnetic biasing layer having a fourth static magnetic polarization,
a third tree layer, the third free layer being capable of magnetic polarization via magnetic induction caused by at least one of: the magnetic polarization of the first free layer, the magnetic polarization of the second free layer, or the static magnetic polarization of the magnetic basing layer, wherein the magnetic biasing layer is proximate to the third free layer,
a third fixed layer, the third fixed layer having a third static magnetic polarization, and
a third spacer layer disposed between (i) the combination of the third free layer and the magnetic biasing layer and (ii) the third fixed layer.

16. The system of claim 15, wherein:
a resistance characteristic of the third spacer layer depends on whether the third free layer is magnetically polarized in a first direction that is antiparallel to the third static magnetic polarization of the third fixed layer or is magnetically polarized in a second direction that is parallel to the third static magnetic polarization of the third fixed layer; and the output element is configured to output, in response to receiving a read voltage applied from the third free layer to the third fixed layer, a current that indicates the resistance characteristic of the third spacer layer.

17. The system of claim 15, further comprising:

a first support structure disposed between the first magnetic latch and the output element; and a second support structure disposed between the second magnetic latch and the output element.

18. The system of claim 17, wherein the first support structure comprises a magnetically permeable, electrically insulating material.

19. The system of claim 15, wherein the system is configured to function as an AND gate.

20. The system of claim 15, wherein the system is configured to function as an OR gate.

* * * * *